(12) United States Patent
Duley (10) Patent No.: US 6,979,784 B1
(45) Date of Patent: Dec. 27, 2005

(54) COMPONENT POWER INTERFACE BOARD (75) Inventor: Raymond S. Duley, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 11 days.

(21) Appl. No.: 10/688,817

(22) Filed: Oct. 17, 2003

(51) Int. Cl.$^7$ .............................................. H05K 1/16
(52) U.S. Cl. ...................... 174/260; 174/261; 361/783; 361/784; 361/803
(58) Field of Search ................................ 174/260–266, 174/254; 361/792–795, 760, 767–771, 783, 361/784, 803; 439/65–75; 257/690–700

(56) References Cited

U.S. PATENT DOCUMENTS

| | | | |
|---|---|---|---|
| 4,616,655 A * | 10/1986 | Weinberg et al. ............... | 607/2 |
| 5,136,471 A * | 8/1992 | Inasaka ....................... | 361/794 |
| 5,313,096 A * | 5/1994 | Eide ........................... | 257/686 |
| 5,315,069 A * | 5/1994 | Gebara ........................ | 174/250 |
| 5,574,630 A * | 11/1996 | Kresge et al. ............... | 361/792 |
| 5,894,411 A * | 4/1999 | Embo et al. ................. | 361/774 |
| 6,239,485 B1 * | 5/2001 | Peters et al. ................. | 257/700 |
| 6,304,450 B1 | 10/2001 | DiBene, II et al. | |
| 6,326,647 B1 * | 12/2001 | Chiu ........................... | 257/99 |
| 6,356,448 B1 | 3/2002 | DiBene, II et al. | |
| 6,452,113 B2 | 9/2002 | DiBene, II et al. | |
| 6,452,804 B1 | 9/2002 | DiBene, II et al. | |
| 6,490,160 B2 | 12/2002 | DiBene, II et al. | |
| 6,501,103 B1 * | 12/2002 | Jory et al. ................... | 257/100 |
| 6,556,455 B2 | 4/2003 | DiBene, II et al. | |
| 6,558,169 B2 * | 5/2003 | Figueroa et al. ............. | 439/70 |
| 6,642,730 B1 * | 11/2003 | Hembree et al. ........... | 324/755 |
| 2002/0172022 A1 | 11/2002 | DiBene, II et al. | |
| 2003/0002268 A1 | 1/2003 | DiBene, II et al. | |
| 2003/0057548 A1 | 3/2003 | Hartke et al. | |

FOREIGN PATENT DOCUMENTS

| | | |
|---|---|---|
| EP | 1 256 263 | 11/2002 |
| EP | 1 261 999 | 12/2002 |
| WO | 01/06821 A1 | 1/2001 |
| WO | 01/33927 A1 | 5/2001 |
| WO | 01/65344 A2 | 9/2001 |
| WO | 02/089260 A2 | 11/2002 |
| WO | 02/089260 A3 | 11/2002 |

OTHER PUBLICATIONS

Sutono et al., Experimental Modeling, Repeatability Investigation and Optimization of Microwave Bond Wire Interconnects, IEEE Transactions on Advanced Packaging, vol. 24, No. 4, 595-603 (Nov. 2001).

(Continued)

Primary Examiner—Kamand Cuneo
Assistant Examiner—Jeremy Norris
(74) Attorney, Agent, or Firm—Lawrence J. Merkel; Meyertons, Hood, Kivlin, Kowert & Goetzel, P.C.

(57) ABSTRACT

A component may comprise one or more integrated circuits and a component package to which the one or more integrated circuits are coupled. The component package has a bottom comprising a plurality of conductors for providing signal connection to the one or more integrated circuits, a top to which the one or more integrated circuits are coupled, and a plurality of sides. At least one of sides includes at least one power pad for providing a power supply voltage to the one or more integrated circuits. At least one of the plurality of sides includes at least one ground pad for providing a ground to the one or more integrated circuits.

21 Claims, 6 Drawing Sheets

OTHER PUBLICATIONS

Alpha Industries, Circuit Models for Plastic Packaged Microwave Diodes, Application Note 1001, 1-4 (Jun. 1999).

Cherry et al., FDTD Analysis of High Frequency Electronic Interconnection Effects, IEEE Transactions on Microwave Theory and Techniques, vol. 43, No. 10, 2445-51 (Oct. 1995).

Yun et al., Parasitic Impedance Analysis of Double Bonding Wires for High-Frequency Integrated Circuit Packaging, IEEE Microwave and Guided Wave Letters, vol. 5, No. 9, 296-98 (Sep. 1995).

Jim Hjerpe, "Power Distribution for High-Performance Processors," HDI, The Magazine of High-Density Interconnect, vol. 3, No. 10, Oct. 2000, pp. 22-24.

INCEP Technologies, Inc., "High-Current Processor Power Delivery Systems," 2003, 4 pages.

INCEP Technologies, Inc., "INVEP ZRAM™ Architecture," 2003, 5 pages.

Prismark Partners LLC, "Power Demands in High-End Microprocessors," Feb. 2002, 14 pages.

* cited by examiner

COMPONENT POWER INTERFACE BOARD

BACKGROUND OF THE INVENTION

1. Field of the Invention

This invention is related to integrated circuit components and, more particularly, to supplying integrated circuit components with power.

2. Description of the Related Art

Over time, the magnitude of the supply voltage for various integrated circuits has been reduced. Where 5 volts and even higher was once a common voltage magnitude, more recent integrated circuits have specified supply voltage magnitudes in the range of 1.5 volts. In the future, the magnitude of the voltage is expected to decrease even further.

At the same time, the number of transistors included in the integrated circuits has continued to increase, and the power requirements of the integrated circuits have continued to grow. For example, modern processor products often consume 50–100 watts of power. If a supply voltage of 1.5 volts is presumed, the current required to supply 50–100 watts of power is on the order of 30–60 amps. Future processor generations are expected to grow the power consumption as well, requiring in excess of 100 amps of current at the expected supply voltage magnitudes.

High currents such as those now being experienced and those expected in the future are problematic. First, the integrated circuits are typically packaged in a device having pins for connecting the integrated circuits to a circuit board such as the mother board of a computer. The pins are relatively small in cross section, and thus the current that the pin can sink or source without damage is limited. In many current integrated circuits, as much as ⅔ of the package pins are dedicated to power and ground connections. To support high currents, even more of the package pins would have to be dedicated to power and ground connections, limiting the number of pins available for signal connections. Second, managing such high currents on the mother board is problematic, especially for the less expensive motherboard designs typically used in, for example, personal computers.

One attempt to address the high current issues is implemented in the Itanium 2 processor product manufactured by Intel Corp. (Santa Clara, Calif.). The Itanium 2 processor product includes an integrated circuit implementing the processor, attached to a printed circuit board. The printed circuit board also includes voltage regulation circuitry that receives a relatively high voltage input to the board (e.g. 12 volts), and reduces the voltage magnitude to the supply voltage used by the processor (e.g. 1.5 volts). The input to the board may be from a power pod module coupled to the board with a flexible connector. Power pod modules may be available from, e.g., Tyco Electronics, Inc., Celestica Power Systems, or Delta Electronics, Inc. The higher voltage input to the board may permit the current input to the board to be lower than the current input to the processor (since power is the product of voltage and current). However, this solution may be costly, since components to perform voltage regulation/power conversion with a physical size that is appropriate for the board may be expensive. Additionally, the processor manufacturer must become involved in board manufacturing, voltage regulator component stocking, managing lead time for the components of the voltage regulator, etc.

Another attempt to address the high current issues, implemented by Incep Technologies, Inc. (San Diego, Calif.), includes the voltage regulation module above the integrated circuit, between the heat sink and the integrated circuit. This approach also may be costly, as the components used to form the voltage regulation module must be small so as to fit between the heat sink and the integrated circuit. Furthermore, the current limits of such small components may limit the applicability of this solution in future products.

SUMMARY OF THE INVENTION

In one embodiment, a component comprises one or more integrated circuits and a component package to which the one or more integrated circuits are coupled. The component package has a bottom comprising a plurality of conductors for providing signal connection to the one or more integrated circuits, a top to which the one or more integrated circuits are coupled, and a plurality of sides. At least one of sides includes at least one power pad for providing a power supply voltage to the one or more integrated circuits. At least one of the plurality of sides includes at least one ground pad for providing a ground to the one or more integrated circuits. In another embodiment, an apparatus comprises the above component and a circuit board. The circuit board is configured to be placed over a top of the component, and includes a bottom side that faces the component during use. The bottom side of the second circuit board comprises a first plurality of conductive pads to be electrically coupled to the power and ground pads on the component to supply power and ground connection to the component.

In yet another embodiment, an apparatus for supplying power and ground connection to a component that is to be coupled to a first circuit board during use is contemplated. The first circuit board includes conductors for signal communication with the component. A power supply module is also coupled to the first circuit board during use, wherein the power supply module is arranged to a side of the component during use. The apparatus comprises a second circuit board and at least one connector. The second circuit board is configured to be placed over a top of the component, wherein signal connection between the first circuit board and the component is made with a bottom of the component. The second circuit board includes a bottom side that faces the component during use. The bottom side of the second circuit board comprises a first plurality of conductive pads to be electrically coupled to a corresponding second plurality of conductive pads on the component. The second plurality of conductive pads supply power and ground connection to the component during use. The second circuit board includes a portion that extends beyond a first edge of the component, the first edge being nearest the power supply module. The connector is coupled to the portion of the second circuit board that extends beyond the first edge of the component, and is configured to couple to the power supply module during use.

Other embodiments of an apparatus may comprise a component that is to be coupled to a first circuit board during use, a power supply module, and a second circuit board. The first circuit board includes conductors for signal communication with the component. The power supply module is to be coupled to the first circuit board during use, wherein the power supply module is arranged to a side of the component during use. The second circuit board is configured to be placed over a top of the component, wherein signal connection between the first circuit board and the component is made with a bottom of the component. The second circuit board includes a bottom side that faces the component during use, and the bottom side of the second circuit board comprises a first plurality of conductive pads to be electrically coupled to a corresponding second plurality of conductive pads on the component. The second plurality of conductive pads supply power and ground connection to the component during use. The portion of the second circuit board and the power supply module are coupled, during use.

In still other embodiments, an apparatus comprises a component that is to be coupled to a first circuit board during use, a power supply module, and a second circuit board. The first circuit board includes conductors for signal communication with the component, and the signals include a first one or more signals identifying, during use, a magnitude of a power supply voltage to be supplied to the component during use. The power supply module is to be coupled to the first circuit board during use, and is coupled to receive the first one or more signals through the first circuit board and configured to generate the magnitude of the power supply voltage. The second circuit board is configured to be placed over a top of the component, wherein signal connection between the first circuit board and the component is made with a bottom of the component. The second circuit board includes a bottom side that faces the component during use, and the bottom side of the second circuit board comprises a first plurality of conductive pads to be electrically coupled to a corresponding second plurality of conductive pads on the component. The second plurality of conductive pads supply power and ground connection to the component during use. The second circuit board and the power supply module are coupled, during use.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Figure 1:
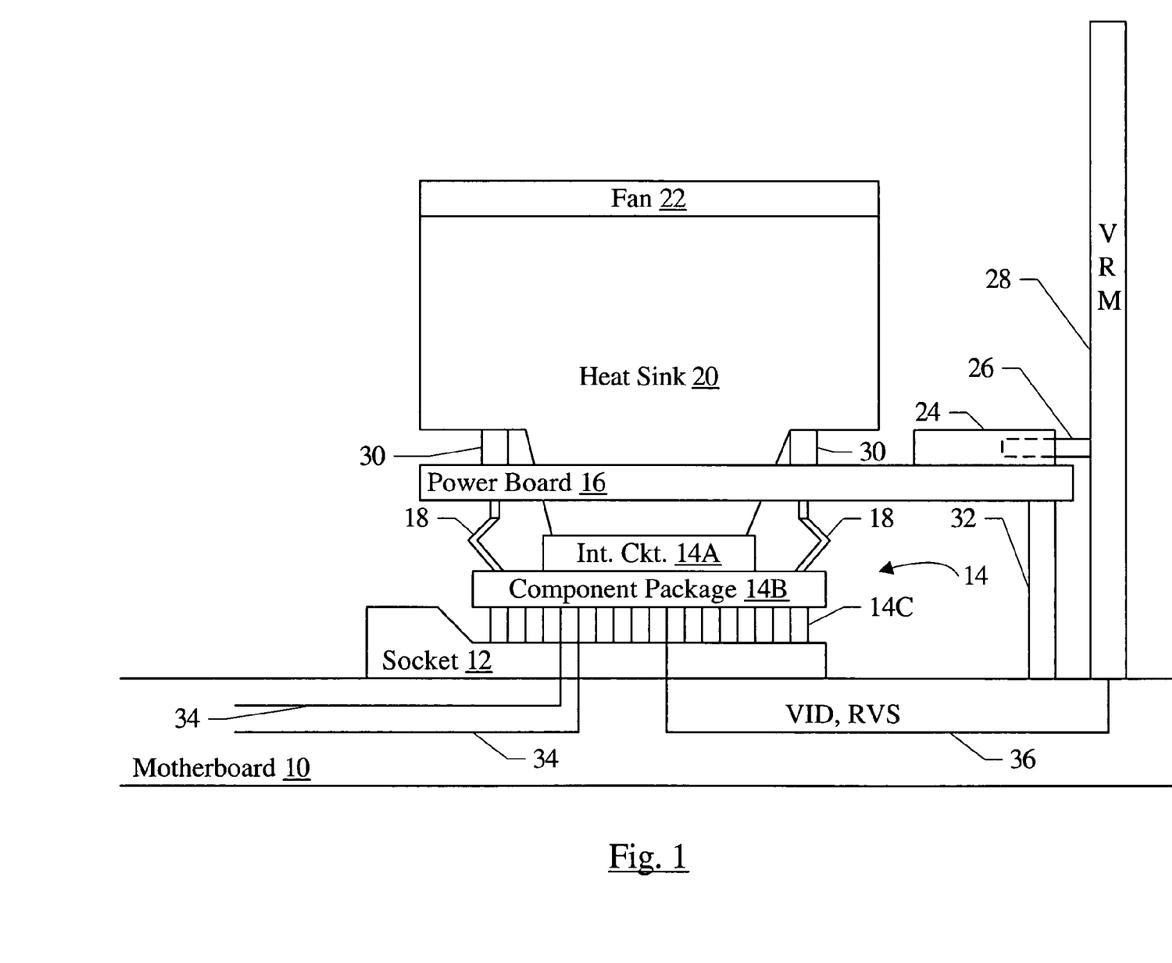
FIG. 1 is a block diagram of a portion of one embodiment of an electronic system.

Turning now to FIG. 1, a block diagram illustrating a portion of one embodiment of an electronic system is shown. In the illustrated embodiment, the electronic system may include a first circuit board (labeled motherboard) 10, a socket 12, a component 14 (comprising one or more integrated circuits such as integrated circuit 14A and a component package 14B in the illustrated embodiment), a power board 16, spring connectors 18, a heat sink 20, a fan 22, a connector 24 on the power board 16, a corresponding connector 26 on a voltage regulation module (VRM) 28, and standoffs 30 and 32.

In some embodiments, the electronic system may be a computer system such as a personal computer (PC) or a server computer system. A computer system will be used at various points herein as an example, and a processor may be used as an example of the component 14. However, any electronic system that employs circuit boards and components attached thereto may be used in other examples and embodiments. As used herein, a circuit board may include any structure of alternating layers of conductors and insulating material used to couple various components and other electrical devices together. The insulating material layers may include vias to connect conductors in adjoining layers above and below the insulating material layers. For example, a printed circuit board may be an exemplary circuit board. In the illustrated embodiment, each of the motherboard 10 and the power board 16 may be examples of circuit boards. A component may comprise any combination of one or more integrated circuits and a package used to provide electrical interface between the integrated circuit(s) and other components, circuit boards, etc. For simplicity herein, a component may at some points be discussed as including one integrated circuit. However, in general, more than one integrated circuit may be included in the component.

The component packet 14B may include a plurality of pins 14C that are used to connect the component 14 to a circuit board such as the motherboard 10 (e.g. through the socket 12, in the illustrated embodiment). Generally, the pins 14C may comprise any conductors for providing electrical connectivity between the component 14 and a circuit board. The pins 14C may be any of a variety of constructions, such as pin grid arrays (PGAs), ball grid arrays (BGAs), etc. The pins 14C may be used to provide signal connection to the component 14 (that is, communicative signals such as input, output, and input/output signals as opposed to power and ground connections). Thus, signal connection may be provided through the bottom side of the component 14 (the side nearest the motherboard 10). For example, various conductors 34 in the motherboard 10 may be electrically coupled to various pins 14C for communication with other components/devices. The package 14B may further comprise any electrical interconnection between the pins 14C and the integrated circuit 14A. For example, in some embodiments, the packet 14B may comprise a circuit board providing the electrical interconnection and also including power and ground planes for supplying power supply voltage and ground to the integrated circuit 14A. In some embodiments, the package 14B may comprise an organic package, and in some other embodiments the package 14B may comprise a ceramic package. In other embodiments, the package 14B may comprise discrete conductors between each pin and the integrated circuit 14A.

On the other hand, power and ground connection may be made through the power board 16 to the top side of the component 14 (that is, the side of the component 14 opposite the side of the component 14 that faces the motherboard 10), in the illustrated embodiment. More particularly, the power and ground connection may be made through the power board 16 to the top side of the component package 14B, in the illustrated embodiment.

The power board 16 may be positioned above the component 14 (e.g., between the component 14 and the heat sink 20, as shown in FIG. 1) and may be coupled to the VRM 28 through the connectors 24 and 26. The VRM 28 may supply the voltage magnitude and current requirements of the component 14 to the power board 16, which may convey the voltage/current to the top of the component 14 (e.g. through the spring connectors 18 in the illustrated embodiment).

By supplying power and ground connection to the top of the component 14, the pins 14C may be dedicated to providing signal interconnection, in some embodiments. The pins 14C may not be required to source or sink large currents associated with the power and ground connections, in some embodiments, but rather the typically smaller signal currents.

In some embodiments, the component 14 may output one or more signals identifying the voltage magnitude required by the component 14. These voltage identification (VID) signals may be routed through pins 14C, the motherboard 10 (e.g. conductors 36 in FIG. 1), to the VRM 28. In one embodiment in which the component 14 is a processor, for example, there may be 5 VID signals. The VRM 28 may generate the voltage of the desired magnitude for transmission through the power board 16 to the component 14. In some embodiments, the VRM 28 may also measure the voltage actually received by the component 14 using a pair of remote voltage sense (RVS) lines, and may use the measured voltage as feedback for generating the voltage by the VRM 28, to ensure that the voltage magnitude actually received by the component 14 (taking into account an $I^2R$ losses in the connectors 24 and 26, the power board 16, and the connectors 18) is the voltage indicated on the VID signals (or a close approximation thereof). The RVS lines may also be routed through the motherboard 10 from to the VRM 28. By routing signals communicating between the component 14 and the VRM 28 through the motherboard 10, only power and ground pads need be provided on the top of the component 14 (and on the power board 16) which may maximize the number of power and ground pads (and thus the amount of current that may be supplied to the component 14). Additionally, the power board 16 may be relatively simple, since it delivers power and ground to the component 14 and does not route signals between the component 14 and the VRM 28.

The power board 16 may extend horizontally beyond an edge of the component package 14B to make connection with the VRM 28. For example, in the orientation shown in FIG. 1, the power board 16 extends to the right beyond the right edge of the component package 14B to make contact with the VRM 28. In this fashion, the VRM 28 may be arranged to a side of the component 14 (other than the top or bottom side) and thus may be relatively independent of the component assembly. Standard VRMs 28 may be used, such as the VRMs available from Hewlett Packard (Palo Alto, Calif.), Delta Electronics, Inc. (Taiwan), etc. Furthermore, since the VRM 28 is separate from the component assembly, more freedom in the selection of circuitry on the VRM may be enjoyed. For example, inexpensive (often relatively large) devices may be selected to form the VRM 28. Additionally, components capable of high currents may be selectable without much regard to the size of the components.

Viewed in another way, there may be an area defined on the surface of the motherboard 10 (referred to as the "keep out" area) which at least matches the footprint of the heat sink on the motherboard 10. That is, if the keep out area were extended vertically, the resulting volume would encompass the heat sink. The VRM 28 may be arranged outside of the keep out area, and the power board 16 may extend out of the keep out area. In one embodiment, the connector 24 may be affixed to the power board 16 on the portion of the power board 16 that extends beyond the edge of the component 14 and/or out of the keep out area.

While the VRM 28 is shown to the right of the component 14 in the illustrated embodiment, the VRM 28 may be arranged to any side of the component 14 in various embodiments other than the top or bottom side.

The VRM 28 may be coupled to receive input power from the motherboard 10 in the form of a higher voltage magnitude and lower current magnitude than those required by the component 14. Thus, the motherboard 10 need not be designed to handle the relatively high currents that supply the component 14. In some embodiments, existing motherboard technologies may be used. For example, in PC systems, the motherboard 10 may typically comprise 4 layers for providing both power and ground and signal interconnect. Since high currents need not be supported in the motherboard 10, the existing technology may be used, in some embodiments. Furthermore, if current requirements change for future versions of the component 14, the motherboard 10 need not be changed. A new VRM 28 and/or power board 16 may be installed, if necessary.

In the illustrated embodiment, the spring connectors 18 may be used to make electrical connection between the component packet 14B and the power board 16. The spring connectors 18, when not compressed between the power board 16 and the component package 14B, may extend a distance that exceeds the distance between the power board 16 and the component packet 14B. The compression of the spring connectors 18 between the power board 16 and the component package 14B may provide a high quality electrical connection. In one embodiment, the spring connectors 18 may be affixed (e.g. soldered) to the power board 16 and may be compressed against the component package 14B. In another embodiment, the spring connectors 18 may be affixed to the component packet 14B and may be compressed against the power board 16. The power board 16 may comprise a plurality of conductive pads, and the component package 14B may comprise a corresponding plurality of conductive pads (shown in FIGS. 3 and 4, respectively). The spring connectors 18 may comprise a connector, for each of the conductive pads on the power boards 16, that extends between that conductive pad and the corresponding conductive pad on the component package 14B. In yet other embodiments, the power board 16 and the component 14 may be electrically coupled in other ways (e.g. solder connections may be made).

In the illustrated embodiment, the spring connectors 18 may have an "elbow" in the connector that can be compressed to make the connection. Other embodiments may include vertical springs, or any other compressible connector. In one implementation, the spring connectors 18 may be selected from various connectors available from Molex, Inc. (e.g. part number 49Z0000006).

For good thermal conduction from the integrated circuit 14A to the head sink 20, it is desirable for the heat sink 20 to physically contact the integrated circuit 14A (although a thermal adhesive or gel may be used). Thus, the power board 16 may have an opening formed therein to permit passage of a protrusion on the heat sink through the opening to make contact with the integrated circuit 14A.

As mentioned above, in the illustrated embodiment, the spring connectors 18 may be compressed to make electrical connection between the power board 16 and the component 14. The weight of the heat sink 20 may be used to supply some of the compression force. To concentrate the force, standoffs 20 may be applied to the power board 30. The heat sink 20, when in place, may rest on the standoffs 30. The standoffs 30 may be arranged vertically above the spring connectors 18, so that the weight of the heat sink 20 may apply compressive force to the spring connectors 18. The exact position of the standoffs 30 relative to the spring connectors 18 may vary due to manufacturing variations in placement of the standoffs 30. Additionally, the standoffs 30 may be wider, in some embodiments, than the spring connectors 18. However, the nominal placement of the standoffs 30 may be such that at least a portion of the standoffs 30 are vertically aligned to the spring connectors 18. The standoffs 30 may be formed of any substantially resilient materials. For example, in one embodiment, the standoffs 30 may contain rubber. The standoffs 30 may be formed from bulk rubber, or may comprise a rubber-based epoxy or other caulk-like material that may be applied to the power board 16. A standoff 32 may also be used to provide support for the power board 16, as shown in FIG. 1. In other embodiments, the standoff 32 may be eliminated.

The connectors 24 and 26 may be any suitable connector that may support the current requirements of the component 14. For example, in one implementation, the connectors 24 and 26 may be the 2 millimeter quad row shoulder connectors available from Samtec, Inc. (New Albany, Ind.) in the TMMS series (e.g. part number TMMS12-01-T-Q). While the connectors 24 and 26 make a horizontal connection in the illustrated embodiment, in other embodiments the connectors 24 and 26 may make a vertical connection (i.e. one of the connectors 24 or 26 may be substantially above the other when connected). The connector 24 may be attached to either the top side of the power board 16 (as shown in FIG. 1) or the bottom side, in various embodiments. In still other embodiments, the VRM 28 may be integrated onto the power board 16 (on the portion that extends beyond the edge of the component 14 or that is outside of the keep out area of the heat sink 20). In such an embodiment, the power board 16/VRM 28 combination may include a connector to the motherboard 10 to supply power to the VRM 28. One or more connectors 24 (and corresponding connectors 26) may be used in various embodiments.

The socket 12 is coupled to the motherboard 10. For example, the socket 12 may be soldered to the motherboard 10, or otherwise affixed to the motherboard 10 in an essentially permanent fashion. The socket 12 may be provided to permit coupling of the component 14 to the motherboard 10 in a fashion that permits relatively easy insertion and removable. For example, the socket 12 may be a zero insertion force (ZIF) socket of any of a variety of designs. Alternatively, the socket 12 may employ constant frictional force to hold a component 14 in place, in which case the component 14 may be pushed into the socket 12 with enough force to cause the component 14 to slide into the socket. In yet other embodiments, the socket 12 may be eliminated and the component 14 may be affixed to the motherboard (e.g. soldered or otherwise affixed in an essentially permanent fashion).

It is noted that, while the VRM 28 is shown in a vertical arrangement in FIG. 1, the VRM 28 may be horizontal in other embodiments, as desired. It is further noted that FIG. 1 is not intended to be viewed as "to scale". The relative sizes of various elements in FIG. 1 have been skewed to provide clarity and simplicity in the drawings. Similarly, the remaining figures should not be viewed as "to scale" either.

A voltage regulation module (VRM) 28 is shown in the embodiment of FIG. 1. However, generally any power supply module may be used in place of the VRM 28. A power supply module may comprise any device coupled to receive input power (a source voltage and current) and configured to output power at a desired voltage magnitude.

It is noted that the terms "bottom" and "top" have been used with regard to the component 14. These terms may be used in a relative sense with regard to the illustration in FIG. 1. Particularly, "bottom" and "top" may be relative to the motherboard 10. For example, the bottom of the component 14 may be the side that is nearest the motherboard 10 (or that faces the motherboard 10) or other circuit board that provides signal communication to the component 14. The top of the component 14 may be the opposite side of the component 14 than the bottom side. The motherboard 10 itself may, when installed in a housing such as a computer case, be oriented horizontally, vertically, with the component 14 upside down, etc., in various embodiments. The bottom and top of the power board 16 may have a similar interpretation.

It is noted that, in some embodiments of the power board 16 having more than one connector 24, the connectors may be arranged on various sides of the component 14, outside of the heat sink keep out area. Any connectors that are not on the same side of the component 14 as the VRM 28 may be coupled to the VRM 28 with an electrical conductor (e.g. a ribbon cable capable of carrying the current that is to pass through the connector).

Figure 2:
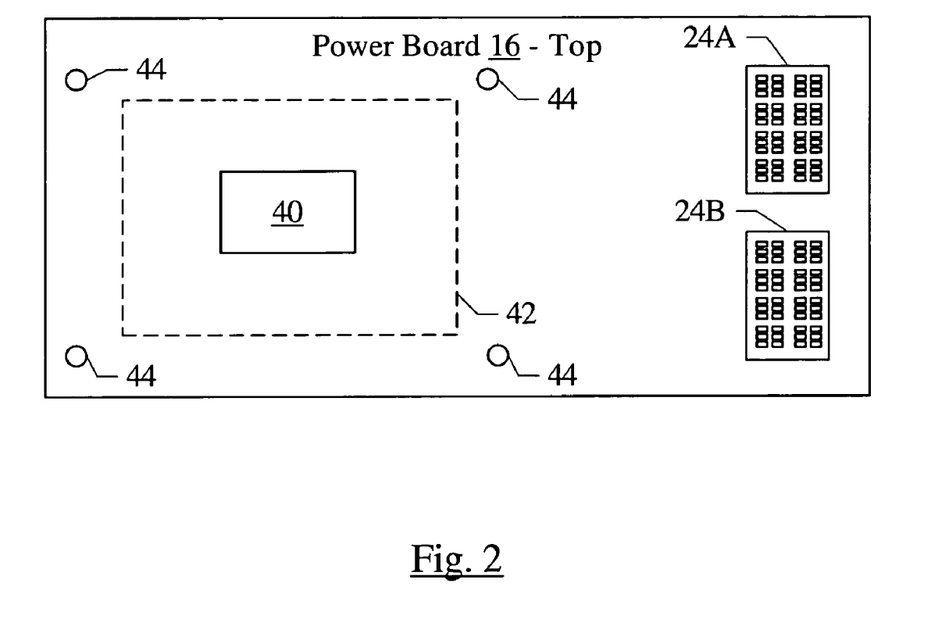
FIG. 2 is a top view of one embodiment of a power board shown in FIG. 1.
Figure 3:
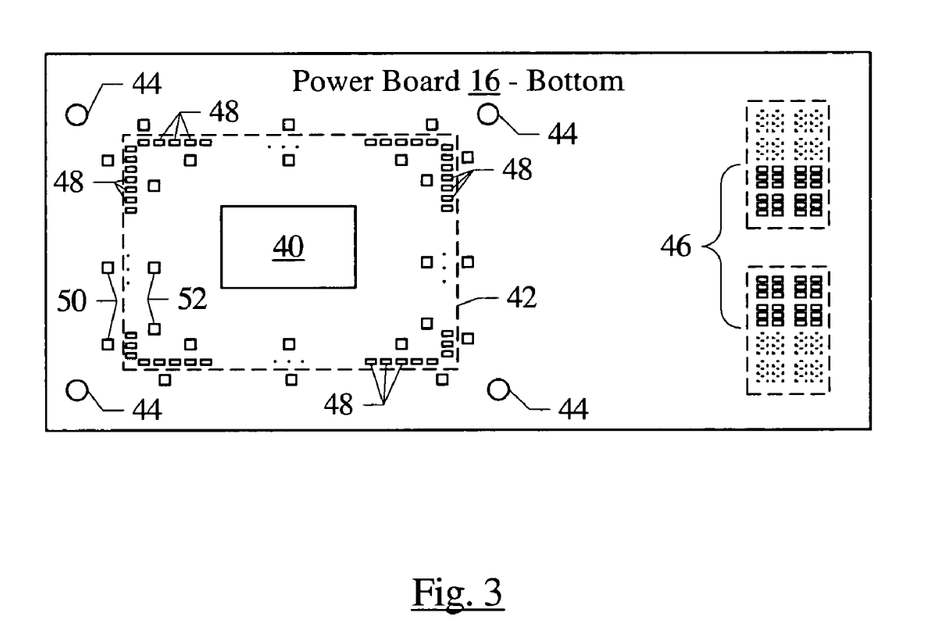
FIG. 3 is a bottom view of one embodiment of a power board shown in FIG. 1.

Turning next to FIGS. 2 and 3, top and bottom views of one embodiment of the power board 16 are shown. FIG. 2 is the top view, and FIG. 3 is the bottom view.

A pair of connectors 24A–24B are shown attached to the top of the power board 16. In the illustrated embodiment, each connector 24A–24B may comprise four rows of 12 pins. Half of the pins may carry power supply voltage (referred to as $V_{Core}$, herein), and the other half of the pins may carry ground (or $V_{SS}$). For example, in one implementation, the outside half of the pins (e.g. the 6 pins in each row that are nearest the outside edges of the power board 16) may carry $V_{Core}$, and the remaining interior pins may carry ground. The top side of the power board 16 may carry one of the voltages, and the bottom side may carry the other. Either voltage may be carried on either side, in various embodiments. For the remainder of this embodiment, $V_{Core}$ will be presumed to be carried on the top side of the power board 16 and ground on the bottom side of the power board 16. Thus, the pins of the connectors 24A–24B the carry $V_{Core}$ may be connected to top side of the power board 16 and the remaining pins may pass through the power board 16 to connect to the bottom side of the power board 16.

Additionally, the opening 40 to permit passage of the protrusion of the heat sink 20 is shown in FIG. 2. A dotted box 42 illustrates the outline of the component 14 when the power board 16 is in place above the component 14. The dotted box 42 is shown merely for illustrative purposes, and does not represent any physical structure on the power board

16. Additionally, in some embodiments, a set of holes 44 may be provided to permit passage of bolts or other fasteners that may be inserted through the heat sink 20 and pass through the motherboard 10 to attach the heat sink 20 to the motherboard 10.

As FIG. 2 illustrates for this embodiment, the top side of the power board 16 does not include any circuitry in the area that the heat sink 20 will cover (since the connectors 24A–24B are arranged outside the area covered by the heat sink 20). Thus, the power board 16 may be relatively resistant to damage when the heat sink 20 is installed.

FIG. 3 includes solder connections 46 for the pins of the connectors 24A–24B that supply the ground voltage (i.e. the interior pins, in the illustrated embodiment). Other pins and the connectors 24A–24B themselves, being on the top side of the power board 16, are shown in dotted form for reference. The dotted box 42 is also shown in FIG. 3 for reference.

A plurality of conductive pads 48 are arranged inside the dotted box 42, to be aligned to corresponding pads on the component 14 during use. In the illustrated embodiment, the conductive pads 48 are arranged around the entire perimeter of the dotted box 42. In other embodiments, additional conductive pads 48 may be provided at various points around the interior of the dotted box 42, as desired. For example, in one particular embodiment, 17 pads may be provided along each edge of the component 14. The conductive pads may be of any desired conductive material. For example, copper or a copper/beryllium alloy is commonly used in conductive pads. The plurality of conductive pads 48 (and the corresponding conductive pads on the component 14) may have any size, spacing, pitch, etc. as desired and to conform to any requirements of the connector to be used between the two. For example, a pitch of 1–2 millimeters (mm) may be typical currently (e.g. 1.27 mm or 1 mm, or even less than 1 mm).

One half of the conductive pads 48 may be used to make $V_{Core}$ connections to the component 14 (power pads), and the other half of the conductive pads 48 may be used to make ground connections (ground pads). In one embodiment, adjacent conductive pads 48 along one edge may alternate between power pads and ground pads. That is, a first conductive pad may be assigned to be a power pad, the next adjacent conductive pad may be a ground pad, the next adjacent conductive pad to the ground pad may be another power pad, etc. Conductive pads may be more succinctly referred to herein as "pads".

Those pads 48 that supply the $V_{Core}$ voltage may be connected, through vias in the power board 16 (not shown), to the top of the power board 16, and may be insulated from the bottom of the power board 16. Pads 48 that supply the ground may be connected to the bottom of the power board 16.

In some embodiments, bypass capacitors and/or terminating resistors may be provided on the bottom side of the power board 16 (e.g. reference numerals 50 and 52). For example, 1 microfarad bypass capacitors 50 may be arranged around the outside of the dotted box 42 and 10 microfarad bypass capacitors 52 may be arranged around the inside of the conductive pads 48.

Figure 4:
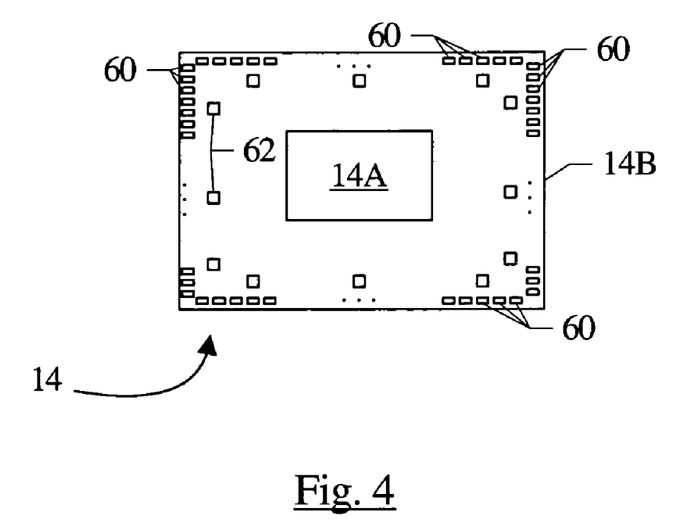
FIG. 4 is a top view of one embodiment of a component shown in FIG. 1.

FIG. 4 is a top view of one embodiment of the component 14. The integrated circuit 14A is shown atop the component package 14B. Arrayed around the periphery of the top of the component package 14B are conductive pads 60. The conductive pads 60 are placed on the component package 14B to align with the pads 48 on the circuit board 16 when the circuit board 16 is in place above the component 16. Manufacturing variations and skew between the circuit board 16 and the component 14 at insertion may prevent perfect alignment, but the pads 60 and 48 may nominally be designed to be aligned during use. Additionally, in some embodiments, the component 14 may include bypass capacitors 62 on the top of the component 14.

Figure 5:
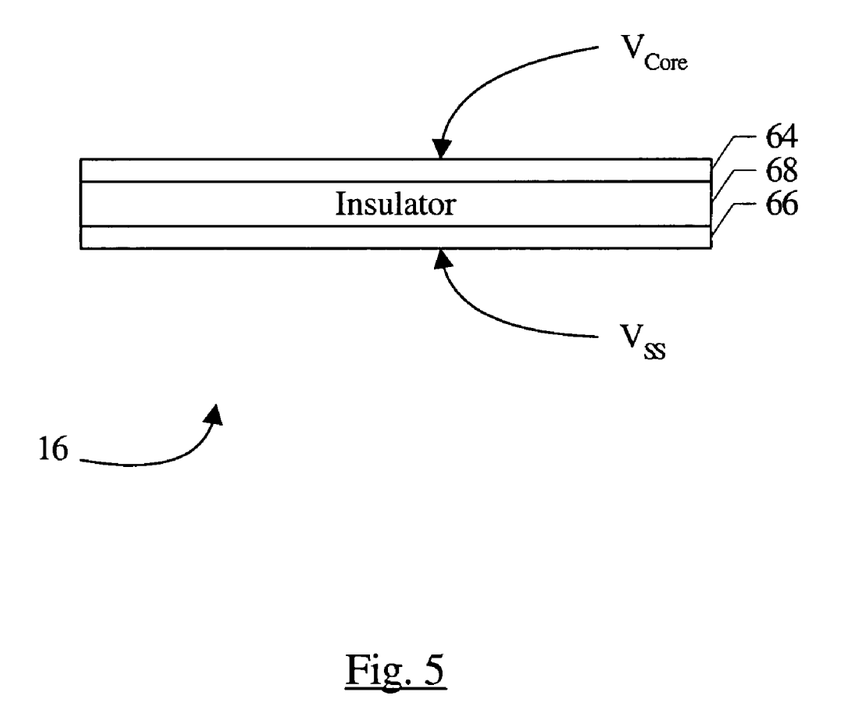
FIG. 5 is a side view of one embodiment of the power board shown in FIG. 1.

FIG. 5 is a side view of one embodiment of the power board 16. In the illustrated embodiment, a two layer board is used. The top layer may comprise a conductive plane 64 that carries the $V_{Core}$ voltage during use, and the bottom layer may comprise a conductive plane 66 the carries ground ($V_{SS}$) during use. An insulating material 68 separates the two planes. The conductive planes 64 and 66 may comprise any conductive material. For example, 2 ounce copper may form the conductive planes 64 and 66. Other embodiments may use other amounts of copper (e.g. 1 ounce, 4 ounce, etc.). The insulator material 68 may be any generally non-conductive material. For example, the insulator material 68 may comprise FR4 or prepreg material commonly used in printed circuit boards. In some embodiments, FR4 may be created from electrical alkali-free glass cloth that has been impregnated with an epoxy resin under pressure and heat.

While FIG. 5 illustrates a 2 layer power board 16, other embodiments may include additional layers. For example, in some embodiments, the current requirements of the component 14 may be high enough that the $I^2R$ voltage drop across the single voltage plane 64 may cause too much variation in the $V_{Core}$ voltage supplied at the pads 48 that are farthest from the connectors 24A–24B as compared to the $V_{Core}$ voltage supplied at the pads 48 that are nearest the connectors 24A–24B. In such cases, additional layers may be used (separated by insulating materials) and a plurality of voltage planes may be created on each layer to supply $V_{Core}$ voltage to various pads 48. The voltage planes may be designed to provide connectivity for each plane to an equal number of pins (for each plane) of the connectors 24A–24B that supply $V_{Core}$ voltage, and to approximate equalizing the $I^2R$ drop across each of the planes. Thus, planes to farther pads 48 (farther from the connectors 24A–24B) may be larger, in area, than planes to closer pads 48 (closer to the connectors 24A–24B).

Figure 6:
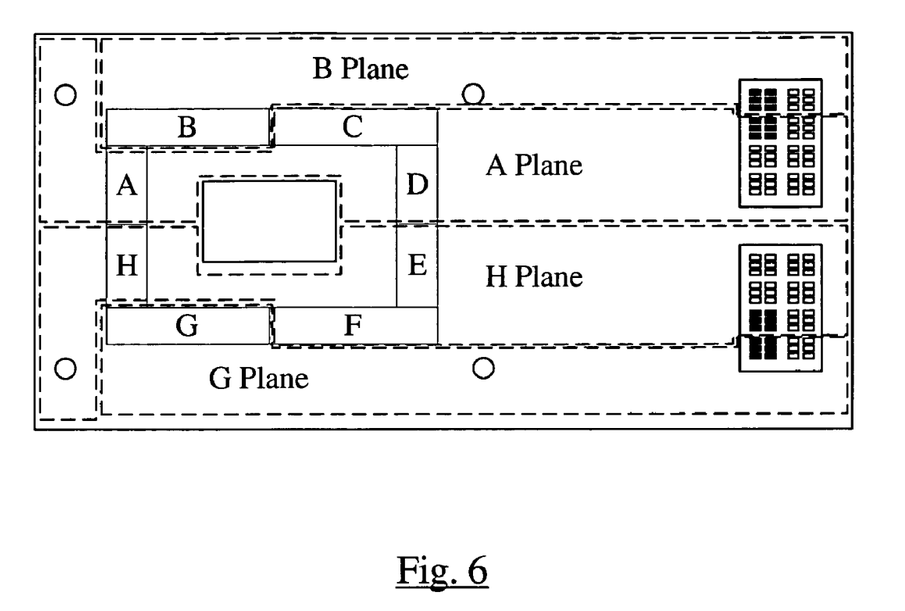
FIG. 6 is a block diagram of one embodiment of a first power supply layer of one embodiment of the power board shown in FIG. 1.
Figure 7:
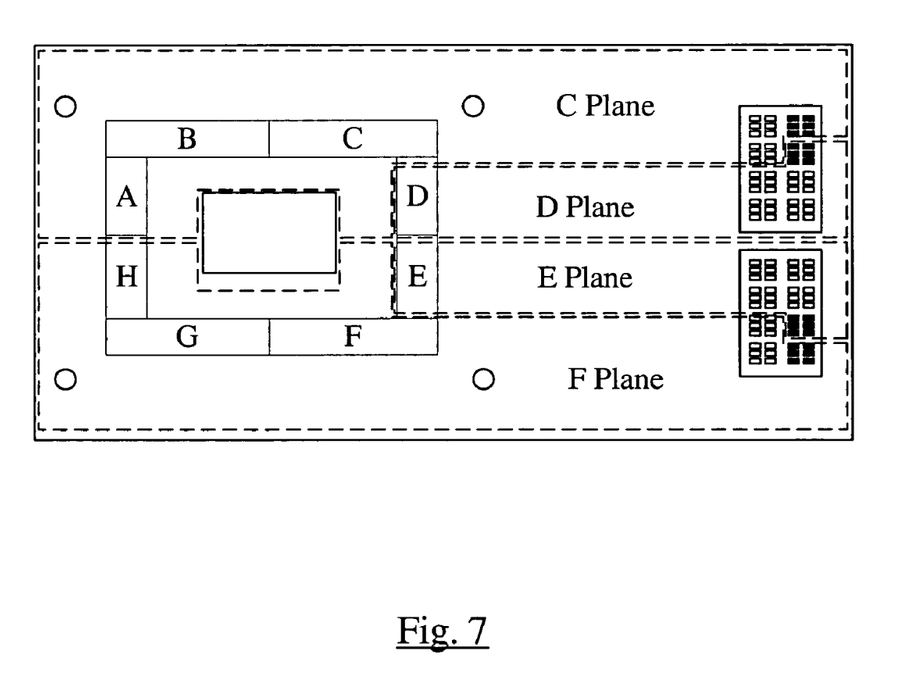
FIG. 7 is a block diagram of one embodiment of a second power supply layer of one embodiment of the power board shown in FIG. 1.

FIGS. 6 and 7 illustrate a set of power planes for a four layer embodiment (2 layers $V_{Core}$ and 2 layers ground). Power supply pins of the connectors 24A–24B that are coupled to each plane are filled in, as shown in FIGS. 6 and 7, for one embodiment. The pads are divided into eight zones, illustrated as rectangular boxes labeled A through H. FIG. 6 illustrates planes for zones A, B, G, and H (enclosed by dashed lines and labeled A plane, B Plane, G Plane, and H plane, respectively). Similarly, FIG. 7 illustrates planes for zones C, D, E, and F (enclosed by dashed lines and labeled C plane, D Plane, E Plane, and F plane, respectively). The ground planes may be arrange similarly, or may be solid, single planes per layer.

The above embodiment included a component 14 having power and ground pads on a top of the component package 14B. In such embodiments, vias within the component packet 14B couple the power and ground pads to power and ground planes within the package 14B (which supply power and ground to the integrated circuit 14A). These vias are typically smaller than vias in printed circuit boards, and are often referred to as "microvias". The microvias may themselves have current limits that may be exceeded by the current requirements of the integrated circuit 14A. To eliminate the microvias, another embodiment is contemplated in which power and ground pads are provided on the sides of the component package 14B. The pads may be inserted far enough into the sides of the component package 14B to directly contact the power and ground planes in the interior of the component package 14B. The pads may be made relatively large, and thus may have higher current capabilities than the microvias.

Figure 8:
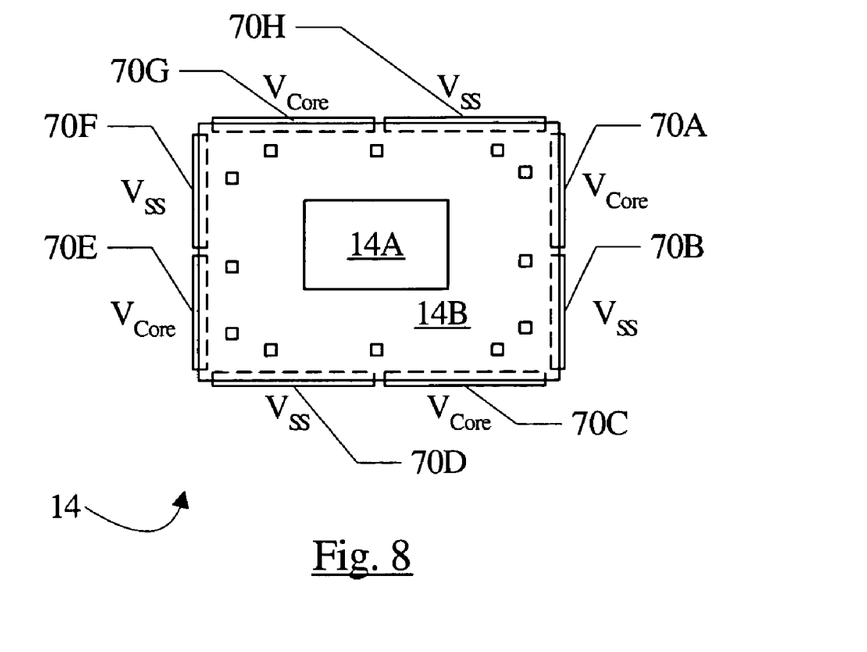
FIG. 8 is a top view of one embodiment of the component shown in FIG. 1 having side pads for power and ground instead of top pads.

FIG. 8 is a top view of one embodiment of the component 14 having power and ground pads 70A–70H on the sides of the component package 14B. Signal pins may still be provided on the bottom of the component 14, similar to the embodiment of FIGS. 1–7. Additionally, while one integrated circuit 14A is shown, other embodiments may include more than one integrated circuit in a component 14.

In the embodiment illustrated in FIG. 8, each side of the component 14 may include a pair of pads 70A–70H: one power ($V_{Core}$) and one ground ($V_{SS}$) pad. Other embodiments may include more than two pads on each side, if desired. Still other embodiments may include only one pad per side (either a power or ground pad). In yet another embodiment, one side may include a power pad and the opposite side may include a ground pad, and the other two sides may not include any pads. Adjacent pads moving around the periphery of the component 14 may have the opposite voltage assignments (that is, one pad may be assigned to $V_{Core}$, the next to $V_{SS}$, etc.). The pads 70A–70G are shown extending into the component package 14B (dotted portion of each pad), so as to make contact with the power and ground planes within the component package 14B.

Figure 9:
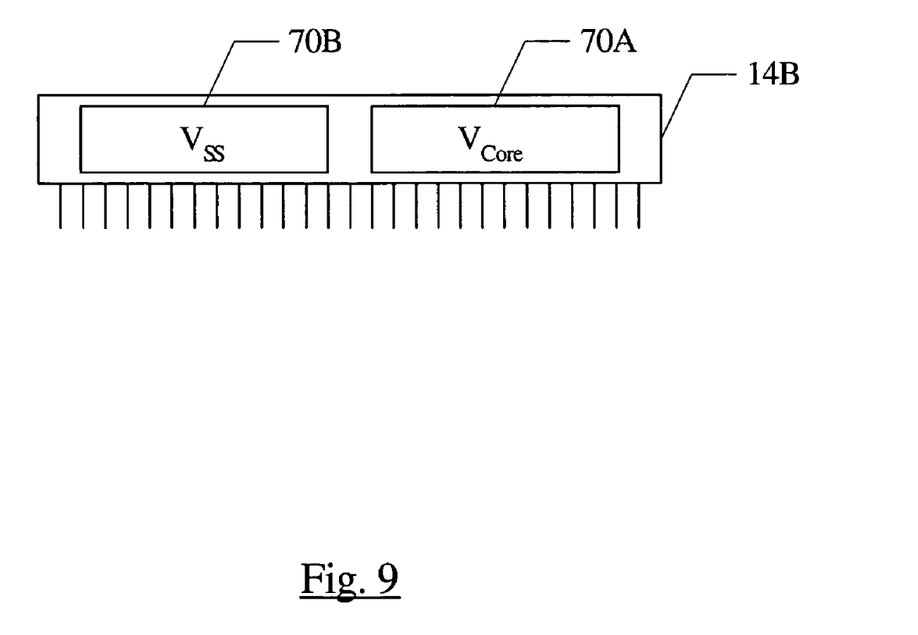
FIG. 9 is a side view of one embodiment of the component, illustrating the side pads.

FIG. 9 is a side view of the component package 14B, illustrating the power ($V_{Core}$) and ground ($V_{SS}$) pads 70A and 70B, for example. As illustrated in FIG. 9, each pad may cover approximately ½ of the side, except for a small amount of clearance around each pad.

The pads 70A–70H may be formed of any conductive material. In one embodiment, the pads 70A–70H may be a beryllium-copper alloy. While generally any mixture of beryllium and copper may be used, in some embodiments a beryllium content of about 0.25% to 2.0% by weight may be used. In other embodiments, copper may be used to form the pads, or any other conductive material may be used.

Figure 10:
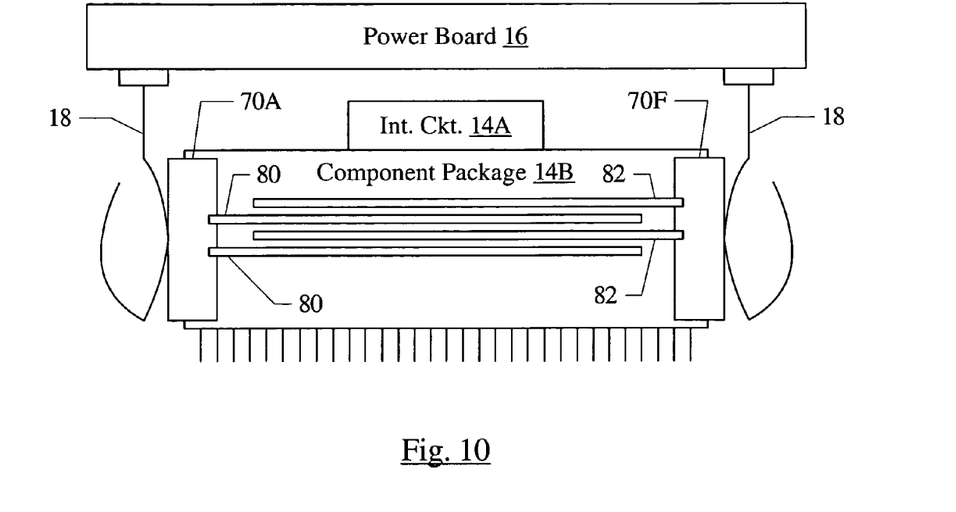
FIG. 10 is a block of one embodiment of the power board and the component having side pads, illustrating connection between the power board and the component and within the component.

FIG. 10 illustrates a block diagram of one embodiment of the power board 16, the component 14, and the spring connectors 18. The embodiment of FIG. 10 may be used in the embodiment of FIG. 1 in a manner similar to the like numbered components of FIG. 1. In the illustrated example, the pads 70A and 70F are shown on each side of the component package 14B. A cross section of the component package 14B is also shown, including power planes 80 and ground planes 82. The power planes 80 make electrical connection with the pad 70A, while the ground planes 82 may electrical connection with the pad 70F. As mentioned above, in one embodiment, the component package 14B may comprise a circuit board having layers of conductors and insulating material to connect the pins 14C to the integrated circuit 14A (the signal layers are not shown in FIG. 10). Additionally, the planes 80 and 82 may be layers that may be used to supply power supply voltage ($V_{Core}$) and ground ($V_{SS}$) to the integrated circuit 14A.

Figure 11:
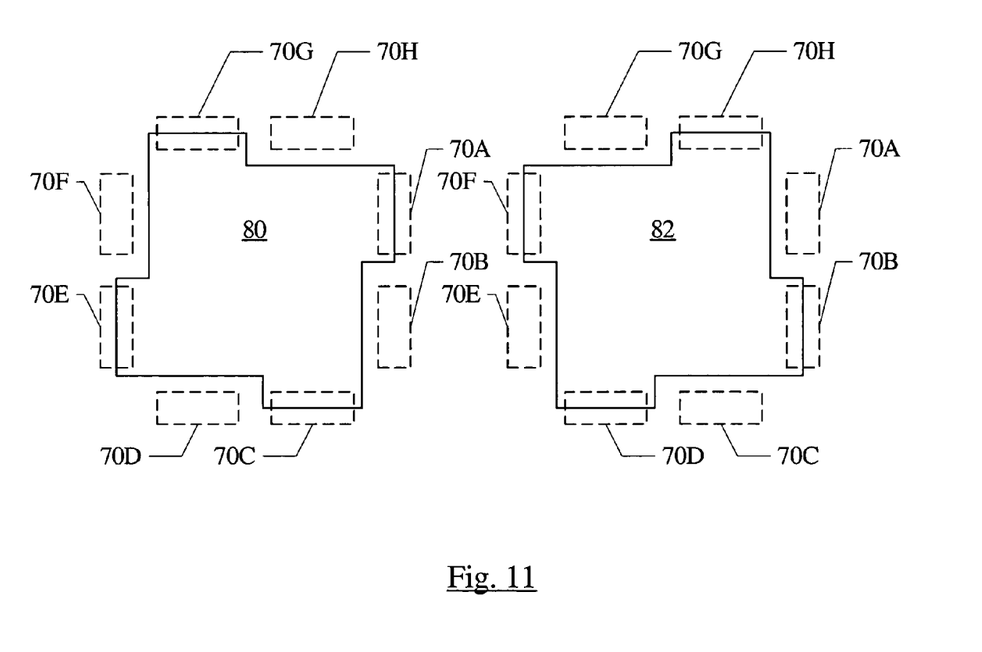
FIG. 11 is a top view of one embodiment of a power or ground plane within the component package.

Each of the planes may be designed to permit electrical connection with the pads 70A–70H assigned to the voltage for that plane and to remain insulated from the pads 70A–70H assigned to the other voltage. Since each side includes a pad for each type of voltage in the present embodiment, the power planes 80 and the ground planes 82 may be as shown in FIG. 11. The pads 70A–70H are shown in dotted form for reference. Other embodiments may differ, depending on the number and arrangement of side pads. Vias to permit signal connection through the planes 80 and/or 82 may be provided, in some embodiments. Such vias are not shown in FIG. 11.

Spring connectors 18 may be used to electrically couple the component 14 and the power board 16. However, in the embodiment of FIG. 10, the spring connectors may apply a more horizontal compression onto the pads 70A–70H, rather than a vertical compression such as is shown in FIG. 1. Exemplary spring connectors, for example, may be obtained from Laird Technologies. In other embodiments, an essentially permanent connection (e.g. soldering) may be made, if desired.

It is noted that, in some embodiments, a "collar" may be placed around the component 14 and in proximity to the component 14, to compress the spring connectors 18 against the pads 70A–70H. Such compression may increase the contact surface of the connectors 18 against the pads 70A–70H. In some embodiments the collar, when viewed from above, may have a "self-alignment" feature comprising an inclined plane shape sloping toward the pads 70A–70H. Thus, as the connectors 18 are pushed into contact with the pads 70A–70H, the collar forces the connectors 18 into close proximity with the pads 70A–70H and may force more contact surface between the connectors 18 and the pads 70A–70H by applying compressive pressure to the connectors 18 in the direction of the pads 70A–70H.

The spring connectors 18 may comprise one connector that contacts substantially all of the length of the corresponding pad 70A–70H, or may comprise multiple connectors (e.g. one per pad on the power board 16), each of which contacts the corresponding pad 70A–70H. It is noted that, while the pads 48 on the power board 16 as shown in FIGS. 2 and 3 were described as alternating, among adjacent pads, between power and ground, the pads 48 may be arranged differently for the embodiment of FIG. 10. The pads above each pad may continuously be either power or ground, depending on whether the pad is a power or ground pad. Thus, the pads along any given edge of the ring of pads shown in FIG. 3 may comprise one half power and one half ground, with each type of pad grouped together on either end of that edge. Furthermore, in other embodiments, the power and ground pads on the power board 16 may be similar in length to the pads on the component 14, and there may be fewer such pads, if desired.

While two power planes 80 and two ground planes 82 are shown in FIG. 10, other embodiments of the component package 14B may include more of each plane, or only one of each plane, as desired. It is noted that, while power and ground pads 70A–70H are shown on each of the sides of the package 14B in the embodiment of FIGS. 8–11, other embodiments may include pads on some of the sides and not others, as desired.

Numerous variations and modifications will become apparent to those skilled in the art once the above disclosure is fully appreciated. It is intended that the following claims be interpreted to embrace all such variations and modifications.

What is claimed is:

1. An apparatus comprising:
 a component comprising one or more integrated circuits and a component package to which the one or more integrated circuits are coupled, the component package having a bottom comprising a plurality of conductors for providing signal connection to the one or more integrated circuits, a top to which the one or more integrated circuits are coupled, and a plurality of sides, wherein at least one of the plurality of sides includes at least one power pad for providing a power supply voltage to the one or more integrated circuits and wherein at least one of the plurality of sides includes at least one ground pad for providing a ground to the one or more integrated circuits; and a circuit board configured to be placed over a top of the component, the circuit board including a bottom side that faces the component during use, the bottom side of the circuit board comprising a first plurality of conductive pads to be electrically coupled to the power and ground pads on the component to supply power and ground connection to the component.

2. The apparatus as recited in claim 1 wherein the circuit board includes a portion that extends beyond a first edge of the component.

3. The apparatus as recited in claim 1 further comprising a power supply module arranged to a side of the component, the first edge being nearest the power supply module.

4. The apparatus as recited in claim 3 further comprising a second circuit board coupled to the plurality of conductors, the second circuit board including conductors for signal communication with the component.

5. The apparatus as recited in claim 4 wherein the power supply module is coupled to the second circuit board, the second circuit board supplying power to the power supply module during use.

6. The apparatus as recited in claim 5 wherein the power supply module is further coupled to receive one or more signals generated by the component indicating the magnitude of the power supply voltage to be supplied to the component, wherein the one or more signals communicated from the component through the second circuit board to the power supply module.

7. The apparatus as recited in claim 6 wherein the power supply module is coupled to receive one or more remote voltage sense signals conveying the power supply voltage received by the component as feedback to generate the power supply voltage, wherein the remote voltage sense signals are communicated through the second circuit board.

8. An apparatus for supplying power and ground connection to a component that is to be coupled to a first circuit board during use, the first circuit board including conductors for signal communication with the component, wherein a power supply module is also coupled to the first circuit board during use, the power supply module arranged to a side of the component during use, the apparatus comprising:

a second circuit board configured to be placed over a top of the component, wherein signal connection between the first circuit board and the component is made with a bottom of the component during use, the second circuit board including a bottom side that faces the component during use, the bottom side of the second circuit board comprising a first plurality of conductive pads to be electrically coupled to a corresponding second plurality of conductive pads on the component, the second plurality of conductive pads supplying power and ground connection to the component during use, and wherein the second circuit board is configured to be coupled to the power supply module during use.

9. The apparatus as recited in claim 8 wherein the second circuit board includes a portion that extends beyond a first edge of the component, the first edge being nearest the power supply module; and wherein the apparatus further comprises:

at least one connector coupled to the portion of the second circuit board that extends beyond the first edge or the component, the connector configured to couple to the power supply module during use.

10. The apparatus as recited in claim 9 wherein the second circuit board comprises:

a first plane that electrically couples the connector to each of the first plurality of conductive pads designated as a power supply pad; and a second plane that electrically couples the connector each of the first plurality of conductive pads designated as a ground pad.

11. The apparatus as recited in claim 9 wherein a first subset of the first plurality of conductive pads are designated as power supply pads and a second subset of the first plurality of conductive pads are designated as ground pads, and wherein the second circuit board comprises a first plurality of layers, each of the first plurality of layers comprising a first plurality of planes, and each of the first plurality of planes electrically coupling the connector to a subset of the power supply pads.

12. The apparatus as recited in claim 11 wherein the second circuit board comprises a second plurality of layers, each of the second plurality of layers comprising a second plurality of planes, and each of the second plurality of planes electrically coupling the connector to a subset or the ground pads.

13. The apparatus as recited in claim 9 wherein the connector is coupled to a top side of the second circuit board.

14. The apparatus as recited in claim 8 wherein the second circuit board includes an opening formed therein to permit passage of a protrusion of a heat sink used for the component.

15. The apparatus as recited in claim 8 further comprising a second connector configured to make electrical connection between the first plurality of conductive pads and the second plurality of conductive pads.

16. The apparatus as recited in claim 15 wherein the second connector is affixed to the first plurality of conductive pals and exerts a force against the second plurality of pads luring use to provide the electrical connection.

17. The apparatus as recited in claim 8 wherein the second circuit board includes a portion that extends beyond a first edge of the component, and wherein the power supply module is coupled to the portion.

18. The apparatus as recited in claim 8 further comprising the component and the power supply module.

19. The apparatus as recited in claim 18 wherein a first set of one or more signals output by the component and communicated through the first circuit board to the power supply module indicate a magnitude of a power supply voltage to be supplied to the component, during use.

20. The apparatus as recited in claim 19 wherein a second set of one or more signals output by the component and communicated through the first circuit board to the power supply module provide a measurement of the voltage supplied to the component during use, as feedback to providing the magnitude indicated by the first set of one or more signals.

21. The apparatus as recited in claim 18 wherein, during use, a heat sink is placed over the component and the second circuit board, and wherein the power supply module is arranged, during use, outside of an area covered by the heat sink.

* * * * *

UNITED STATES PATENT AND TRADEMARK OFFICE
CERTIFICATE OF CORRECTION

PATENT NO. : 6,979,784 B1
DATED : December 27, 2005
INVENTOR(S) : Raymond S. Duley

It is certified that error appears in the above-identified patent and that said Letters Patent is hereby corrected as shown below:

Column 13,
Line 66, between "edge" and "the", delete "or" and insert -- of -- in place.

Column 14,
Line 39, delete "pals" and insert -- pads --.
Line 40, delete "luring" and insert -- during --.

Signed and Sealed this

Fourteenth Day of March, 2006

JON W. DUDAS
*Director of the United States Patent and Trademark Office*